(12) United States Patent
Miller (10) Patent No.: US 8,122,322 B2
(45) Date of Patent: Feb. 21, 2012

(54) SYSTEM AND METHOD OF STORING RELIABILITY DATA

(75) Inventor: Michael Howard Miller, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 1239 days.

(21) Appl. No.: 11/831,045

(22) Filed: Jul. 31, 2007

(65) Prior Publication Data

US 2009/0037644 A1    Feb. 5, 2009

(51) Int. Cl.
*G11C 29/00*    (2006.01)
(52) U.S. Cl. ........................................ 714/766; 714/768
(58) Field of Classification Search .................. 714/766, 714/768
See application file for complete search history.

(56) References Cited

U.S. PATENT DOCUMENTS

| | | | |
|---|---|---|---|
| 5,195,099 A * | 3/1993 | Ueda et al. ................. | 714/766 |
| 5,265,218 A | 11/1993 | Testa et al. | |
| 5,592,629 A | 1/1997 | Gamble | |
| 5,650,967 A | 7/1997 | Seibert | |
| 5,778,418 A | 7/1998 | Auclair et al. | |
| 5,790,831 A | 8/1998 | Lin et al. | |
| 5,860,083 A | 1/1999 | Sukegawa | |
| 5,956,288 A | 9/1999 | Bermingham et al. | |
| 5,999,476 A | 12/1999 | Dutton et al. | |
| 6,016,530 A | 1/2000 | Auclair et al. | |
| 6,034,897 A | 3/2000 | Estakhri et al. | |
| 6,061,754 A | 5/2000 | Cepulis et al. | |
| 6,088,761 A | 7/2000 | Aybay | |
| 6,122,195 A | 9/2000 | Estakhri et al. | |
| 6,125,403 A | 9/2000 | Berliner | |
| 6,128,695 A | 10/2000 | Estakhri et al. | |
| 6,134,151 A | 10/2000 | Estakhri et al. | |
| 6,134,630 A | 10/2000 | McDonald et al. | |
| 6,141,249 A | 10/2000 | Estakhri et al. | |
| 6,202,138 B1 | 3/2001 | Estakhri et al. | |
| 6,223,308 B1 | 4/2001 | Estakhri et al. | |
| 6,247,084 B1 | 6/2001 | Apostol, Jr. et al. | |
| 6,256,232 B1 | 7/2001 | Chang et al. | |
| 6,262,918 B1 | 7/2001 | Estakhri et al. | |

(Continued)

FOREIGN PATENT DOCUMENTS

EP    0 805 397 A2    11/1997

(Continued)

OTHER PUBLICATIONS

Godard, B.; Daga, J.-M.; Torres, L.; Sassatelli, G.; , "Evaluation of Design for Reliability Techniques in Embedded Flash Memories," Design, Automation & Test in Europe Conference & Exhibition, 2007. Date '07 , vol., no., pp. 1-6, Apr. 16-20, 2007 doi: 10.1109/DATE.2007.364529.*

(Continued)

*Primary Examiner* — Cynthia Britt
(74) *Attorney, Agent, or Firm* — Alan G. Rego; Westman, Champlin & Kelly, P.A.

(57) ABSTRACT

Systems and methods of storing error correction data are provided. A method may include storing data at a first memory having a first non-volatile memory type. The method may also include determining error correction data related to the stored data. The method may further include storing the error correction data at a second memory having a second non-volatile memory type. The first non-volatile memory may have a slower random access capability than the second non-volatile memory.

24 Claims, 5 Drawing Sheets

U.S. PATENT DOCUMENTS

| | | | |
|---|---|---|---|
| 6,363,008 B1 | 3/2002 | Wong | |
| 6,370,614 B1 | 4/2002 | Teoman et al. | |
| 6,374,337 B1 | 4/2002 | Estakhri | |
| 6,378,015 B1 | 4/2002 | Yen | |
| 6,393,513 B2 | 5/2002 | Estakhri et al. | |
| 6,397,314 B1 | 5/2002 | Estakhri et al. | |
| 6,411,546 B1 | 6/2002 | Estakhri et al. | |
| 6,449,683 B1 | 9/2002 | Silvester | |
| 6,463,509 B1 | 10/2002 | Teoman et al. | |
| 6,466,736 B1 | 10/2002 | Chen et al. | |
| 6,558,967 B1 | 5/2003 | Wong | |
| 6,567,307 B1 | 5/2003 | Estakhri | |
| 6,574,142 B2 | 6/2003 | Gelke et al. | |
| 6,587,382 B1 | 7/2003 | Estakhri et al. | |
| 6,618,792 B1 | 9/2003 | Perrin et al. | |
| 6,631,456 B2 | 10/2003 | Leighnor et al. | |
| 6,701,480 B1 * | 3/2004 | Karpuszka et al. | 714/764 |
| 6,725,342 B1 | 4/2004 | Coulson | |
| 6,728,851 B1 | 4/2004 | Estakhri et al. | |
| 6,757,800 B1 | 6/2004 | Estakhri et al. | |
| 6,801,979 B1 | 10/2004 | Estakhri | |
| 6,813,678 B1 | 11/2004 | Sinclair et al. | |
| 6,850,995 B1 | 2/2005 | Shishizuki et al. | |
| 6,898,662 B2 | 5/2005 | Gorobets | |
| 6,910,092 B2 | 6/2005 | Calvignac et al. | |
| 6,917,547 B2 | 7/2005 | Kanamori et al. | |
| 6,937,411 B2 | 8/2005 | Goodman et al. | |
| 6,950,918 B1 | 9/2005 | Estakhri | |
| 6,957,295 B1 | 10/2005 | Estakhri | |
| 6,978,342 B1 | 12/2005 | Estakhri et al. | |
| 7,000,064 B2 | 2/2006 | Payne et al. | |
| 7,006,318 B2 | 2/2006 | Stence et al. | |
| 7,075,784 B2 | 7/2006 | Sullivan | |
| 7,082,483 B2 | 7/2006 | Poo | |
| 7,096,378 B2 | 8/2006 | Stence et al. | |
| 7,099,993 B2 | 8/2006 | Keeler | |
| 7,102,671 B1 | 9/2006 | Asnaashari | |
| 7,102,943 B2 | 9/2006 | Kanamori et al. | |
| 7,111,140 B2 | 9/2006 | Estakhri et al. | |
| 7,127,549 B2 | 10/2006 | Sinclair | |
| 7,136,973 B2 | 11/2006 | Sinclair | |
| 7,167,944 B1 | 1/2007 | Estakhri | |
| 7,170,706 B2 | 1/2007 | Stence et al. | |
| 7,185,208 B2 | 2/2007 | Gorobets | |
| 7,215,580 B2 | 5/2007 | Gorobets | |
| 7,231,643 B1 | 6/2007 | Galbo et al. | |
| 7,246,268 B2 | 7/2007 | Craig et al. | |
| 7,823,030 B2 * | 10/2010 | Sutardja et al. | 714/718 |
| 7,827,468 B2 * | 11/2010 | Kato et al. | 714/763 |
| 2002/0002662 A1 | 1/2002 | Olarig et al. | |
| 2002/0156973 A1 | 10/2002 | Ulrich et al. | |
| 2002/0191311 A1 | 12/2002 | Ulrich et al. | |
| 2004/0049629 A1 * | 3/2004 | Miura et al. | 711/105 |
| 2004/0143710 A1 | 7/2004 | Walmsley | |
| 2005/0027908 A1 | 2/2005 | Ong et al. | |
| 2005/0086420 A1 | 4/2005 | Wilcox et al. | |
| 2005/0166004 A1 | 7/2005 | Campanale et al. | |
| 2005/0237327 A1 | 10/2005 | Rubinstein et al. | |
| 2006/0090017 A1 | 4/2006 | Kim et al. | |
| 2006/0149873 A1 | 7/2006 | Underwood et al. | |
| 2007/0067561 A1 | 3/2007 | Kim | |
| 2007/0268905 A1 * | 11/2007 | Baker et al. | 370/392 |
| 2008/0168319 A1 * | 7/2008 | Lee et al. | 714/746 |
| 2008/0215952 A1 * | 9/2008 | Bae | 714/756 |

FOREIGN PATENT DOCUMENTS

| | | |
|---|---|---|
| EP | 0 805 397 A3 | 11/1997 |

OTHER PUBLICATIONS

Katayama, Y.; Negishi, Y.; Morioka, S.; , "Efficient error correction code configurations for quasi-nonvolatile data retention by DRAMs," Defect and Fault Tolerance in VLSI Systems, 2000. Proceedings. IEEE International Symposium on , vol., no., pp. 201-209, 2000doi: 10.1109/DFTVS.2000.887158.*

Gregori, S.; Khouri, O.; Micheloni, R.; Torelli, G.; , "An error control code scheme for multilevel Flash memories," Memory Technology, Design and Testing, IEEE International Workshop on, 2001. , vol., no., pp. 45-49, 2001 doi: 10.1109/MTDT.2001.945227.*

"Hybrid Drive", www.answers.com, Apr. 25, 2007, pp. 1-3.

"What is Hybrid HDD?", www.samsung.com, copyright 1995-2007, pp. 1-2.

"Samsung Teams with Microsoft to Develop First Hybrid Hard Drive with NAND Flash Memory", Press release, www.samsung.com, Apr. 25, 2005, pp. 1-2.

Genuth, Iddo. "Samsung's Hybrid Hard Drive Exposed", www.tfot.info,Oct. 19, 2006, pp. 1-9.

Wilson, Richard. "Samsung Says Flash Drive Boosts Speed of Windows Vista", www.electronicsweekly.com, Apr. 25, 2007, pp. 1-2.

"Hybrid Drive to Extend Notebook Battery Life", www.zdnet.co.uk, Apr. 25, 2005, pp. 1-2.

Nystedt, Dan. "Intel Slashes PC Power-Up Time", Press release, IDG News Service, www.pcworld.com, Oct. 17, 2005, pp. 1-2.

Ramanathan, R.M. "Intel Multi-Core Processors: Making the Move to Quad-Core and Beyond", Technology@Intel Magazine, vol. 4, Issue 9, Dec. 2006, pp. 1-4.

"Intel QuickData Technology—Extends Flexibility of I/O Acceleration", Technology@IntelMagazine, vol. 4, Issue 9, Dec. 2006, pp. 1, 5-8.

Trainor, Michael. "Overcoming Disk Drive Access—Bottlenecks with Intel Robson Technology", Technology@IntelMagazine, vol. 4, Issue 9, Dec. 2006, pp. 1, 9-11.

"A Legacy of Continuing Innovation: Fall 2006 IDF Roundup", Technology@IntelMagazine, vol. 4, Issue 9, Dec. 2006, pp. 1, 12-14.

Alexander, Steve. "Hybrids for PC Drivers", www.StarTribune.com, May 7, 2007, pp. 1-3.

Bisson, Timothy, and Brandt, Scott A. "Reducing Energy Consumption with a Non-Volatile Storage Cache", Proceedings of the 1st International Workshop on Software Support for Portable Storage (IWSSPS), IEEE, 2005, pp. 1-7.

Creasey, Jack. "Hybrid Hard Drives with Non-Volatile Flash and Longhorn", www.microsoft.com, printed Jul. 30, 2007, pp. 1-40.

Nicholson, Clark. "Improved Disk Drive Power Consumption Using Solid State Non-Volatile Memory", www.microsoft.com, printed Jul. 30, 2007, pp. 1-17.

* cited by examiner

SYSTEM AND METHOD OF STORING RELIABILITY DATA

FIELD OF THE DISCLOSURE

The present disclosure is generally related to storing reliability data in a data storage device.

BACKGROUND

Errors may be induced in data stored on certain types of data storage devices, such as hard disc drives. For example, physical impact or interaction with electrical or magnetic fields may induce such errors. To help improve data reliability a storage device may store error detection data (EDD), such as parity bits. In a typical configuration, a portion of data may be stored at a hard disc and EDD may be stored at the hard disc adjacent to the portion of data. To provide additional data reliability certain memory devices may store error correction data (ECD), such as super-parity data. The ECD may be used to assist with reconstructing data in which errors have been induced.

Reading from or writing to some memory devices can be slow relative to other processes within a computer system as a result of the read or write latency of the memory device. Thus, while reading and writing EDD or ECD can improve the reliability of data storage, it can also impair the performance of the data storage system. Hence, there is a need for an improved system and method of storing reliability data.

DETAILED DESCRIPTION OF THE DRAWINGS

In particular embodiment, a system is disclosed that includes a first non-volatile memory of a first memory type to store data. The system may also include an error detection circuit to determine error detection data related to the data stored at the first non-volatile memory. The system may further include a second non-volatile memory of a second memory type to store the error detection data. The first non-volatile memory may have a slower random access capability than the second non-volatile memory.

In another particular embodiment, a method is disclosed that includes storing data at a first memory having a first non-volatile memory type. The method may also include determining error detection data related to the stored data. The method may further include storing the error detection data at a second memory having a second non-volatile memory type. The first non-volatile memory may have a slower random access capability than the second non-volatile memory.

In yet another particular embodiment, a processor-readable medium is disclosed that includes processor-executable instructions to cause a processor to determine error detection data associated with primary data. The primary data may be stored at a first non-volatile memory of a first memory type. The processor-readable medium may also include processor-executable instructions to cause the processor to store the error correction data at a second non-volatile memory of a second memory type. The first memory type may have a slower random access capability than the second memory type.

Figure 1:
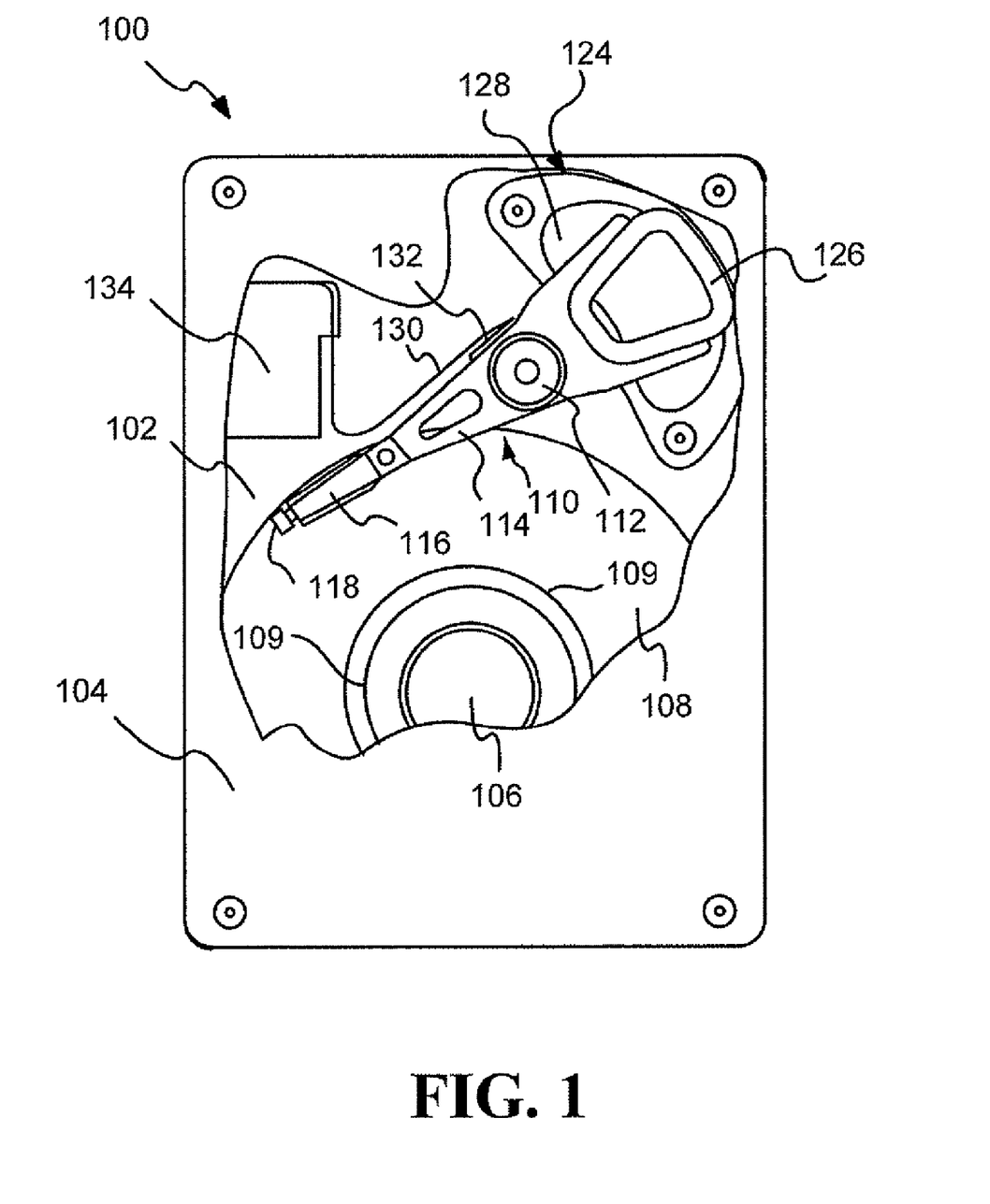
FIG. 1 is a cutaway view of an illustrative embodiment of a disc drive.

Referring to FIG. 1, in a particular embodiment, a disc drive 100 includes a base 102 to which various components of the disc drive 100 are mounted. A top cover 104, shown partially cut away, cooperates with the base 102 to form an internal, sealed environment for the disc drive 100. In a particular embodiment, the top cover 104 and base 102 may form a housing adapted for mounting within a drive bay of a computer chassis. The components of the disc drive 100 include a spindle motor 106, which rotates at least one disc 108. Information is written to and read from tracks on the disc 108 through the use of an actuator assembly 110 that rotates about a bearing shaft assembly 112 positioned adjacent the disc 108. The actuator assembly 110 includes one or more actuator arms 114 that extend toward the disc 108, with one or more flexures 116 extending from the actuator arms 114. Mounted at the distal end of each of the one or more flexures 116 are heads 118 and an air bearing slider (not shown) that enables the heads 118 to fly in close proximity above the corresponding surface of the disc 108.

The track position of the heads 118 is controlled, during a seek operation, through the use of a voice coil motor (VCM) 124 that typically includes a coil 126 attached to the actuator assembly 110, as well as one or more permanent magnets 128 that establish a magnetic field in which the coil 126 is immersed. The controlled application of current to the coil 126 causes magnetic interaction between the permanent magnets 128 and the coil 126 so that the coil 126 moves in accordance with the well-known Lorentz relationship. As the coil 126 moves, the actuator assembly 110 pivots about the bearing shaft assembly 112, and the heads 118 are caused to move across the surface of the disc 108.

A flex assembly 130 provides requisite electrical connection paths for the actuator assembly 110 while allowing pivotal movement of the actuator assembly 110 during operation. The flex assembly 130 can include a printed circuit board 132 to which head wires (not shown) are connected. The head wires may be routed along the actuator arms 114 and the flexures 116 to the heads 118. The printed circuit board 132 may include circuitry for controlling the write currents applied to the heads 118 during a write operation and a preamplifier (not shown) for amplifying read signals generated by the heads 118 during a read operation. The flex assembly 130 terminates at a flex bracket 134 for communication through the base 102 to a disc drive printed circuit board (not shown) mounted to the disc drive 100.

As shown in FIG. 1, a plurality of nominally circular, concentric tracks 109 are located on the surface of the disc 108. Each track 109 includes a number of servo fields that are interspersed with user data fields along the track 109. The user data fields are used to store user data, and the servo fields are used to store servo information used by a disc drive servo system to control the position of the heads 118.

Figure 2:
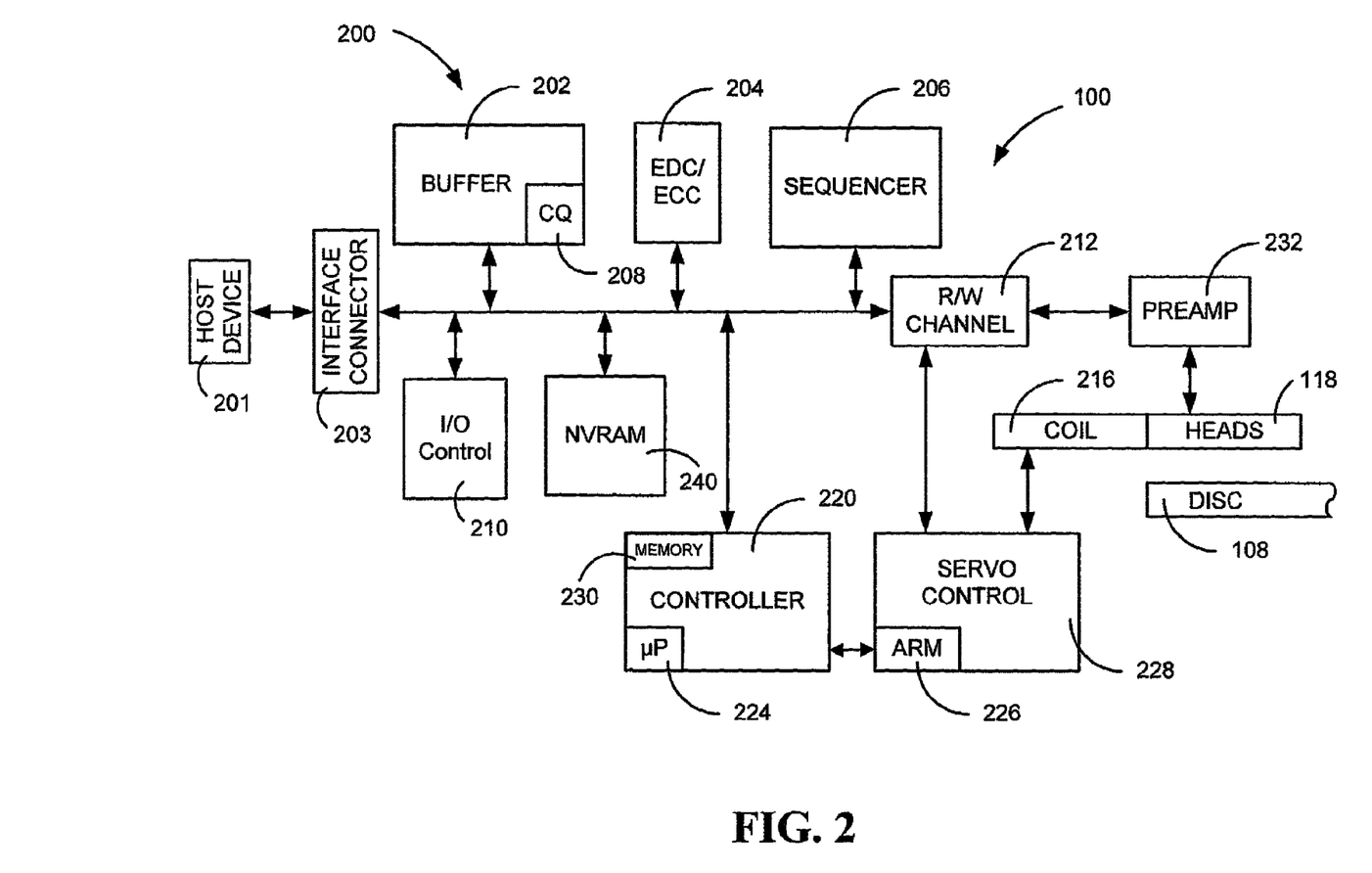
FIG. 2 is a block diagram of an illustrative embodiment of a disc drive system.

FIG. 2 provides a functional block diagram of the disc drive 100. A hardware/firmware based interface circuit 200 communicates with a host device 201 (such as a personal computer or a processor, not shown) via an interface connector 203. The interface connector 203 may be a standardized interface connector in accordance with any of various data interface standards, including but not limited to Small Computer System Interface (SCSI), Serial Attached SCSI (SAS), Advanced Technology Attachment (ATA), Serial ATA (SATA), Fibre Channel (FC), Universal Serial Bus (USB) Compact Flash (CF). The interface connector 203 and the interface circuit 200 may be coupled to a housing, such as the base 102 shown in FIG. 1. The housing with the interface connector 203 and the interface circuit 200 may comprise a single unit such as the disc drive 100 shown in FIG. 1, that may be pluggable into a chassis of the host device 201. The interface connector 203 may be connected to the host device 201 via a direct connection or via a wire connection.

The interface circuit 200 includes a programmable controller 220 with associated microprocessor 224 and memory 230. In a particular embodiment, memory 230 is a first-in-first-out (FIFO) buffer. The interface circuit 200 also includes a buffer 202, an error detection/correction code (EDC/ECC) block 204, a sequencer 206, and an input/output (I/O) control block 210.

The buffer 202 temporarily stores user data during read and write operations, and includes a command queue (CQ) 208 where multiple pending access operations are temporarily stored pending execution. The EDC/ECC block 204 can apply on-the-fly error detection and correction to retrieved data. The EDC/ECC block 204 can determine error detection data and/or error correction data associated with data to be stored. The sequencer 206 asserts read and write gates to direct the reading and writing of data. The I/O block 210 serves as an interface with the host device.

FIG. 2 further shows the disc drive 100 to include a read/write (R/W) channel 212 which encodes data during write operations and reconstructs user data retrieved from the disc 108 during read operations. A preamplifier/driver circuit (preamp) 232 applies write currents to the heads 118 and provides pre-amplification of readback signals.

A servo control circuit 228 uses servo data to provide the appropriate current to the coil 216 to position the heads 118. The controller 220 communicates with a processor 226 at the servo control circuit 228 to move the heads 118 to the desired locations on the disc 108 during execution of the various commands retrieved from the command queue 208.

In a particular embodiment, a solid state non-volatile memory device 240, such as a non-volatile random access memory (NVRAM), may be configured to provide an additional data storage medium. In a particular embodiment, the disc 108 may have a slower random access capability than the solid state non-volatile memory device 240, that is the solid state non-volatile memory device 240 may have a faster access time than the disc 108. The solid state non-volatile memory device 240 may include flash random access memory (Flash RAM or Flash memory), Ferroelectric random access memory (FRAM), magnetoresistive random access memory (MRAM), phase-change memory (PCM), semiconductor-oxide-nitride-oxide-semiconductor memory (SONOS), resistive random access memory (RRAM), other non-volatile memory, or any combination thereof. In a particular embodiment, the disc 108 may be any type of non-volatile memory having a slower access time than the solid state non-volatile memory device 240. For example, the disc 108 may be a magnetic tape storage device, a magnetic disc storage device, an optical storage device, or a magneto-optical storage device.

In a particular embodiment, the memory 230 of the controller 220 may include data and instructions that are executable by the microprocessor 224. The controller 220 maybe adapted to store reliability data (such as EDD, ECD or both) at the solid state non-volatile memory device 240. For example, the EDD/ECD code block 204 may determine EDD, ECD or both for data received from the host device (also called primary data to differentiate the data received from the host from error detection or correction data). The controller may store the primary data at the disc 108, and may store the reliability data at the solid state non-volatile memory device 240. The reliability data may be updated in real time when the primary data is stored. The reliability data may include redundancy information, EDD, ECD, or any other type of data that may improve the reliability of the disc 108.

In a particular embodiment, the controller 220 may be adapted to access EDD at the solid state non-volatile memory device 240 to determine whether an error is present in data retrieved from the disc 108. Additionally, the controller 220 may be adapted to access ECD at the solid state non-volatile memory device 240 to rebuild the primary data when an error is detected in the data stored at the disc 108. The controller may also be adapted to calculate EDD and/or ECD based on the data stored at the disc 108.

Figure 3:
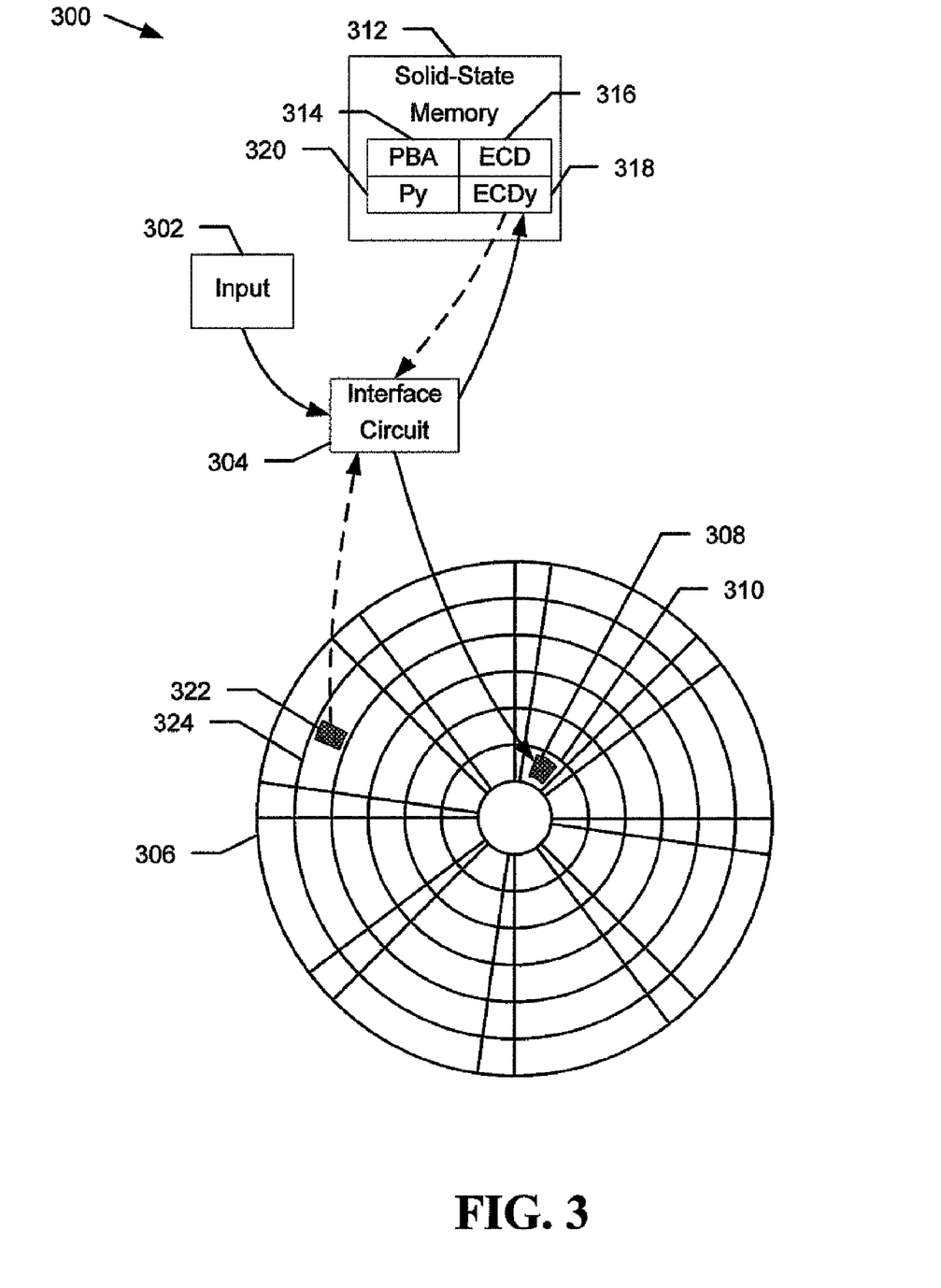
FIG. 3 is a diagram of a particular illustrative embodiment of a system to store reliability data.

Referring to FIG. 3, an embodiment of a system to store reliability data is depicted and generally designated 300. The system 300 includes an input 302 to receive data from a host device. The system also includes logic 304 to receive the data from the input 302, and to control the storing of the received data (also referred to as primary data).

In a particular illustrative embodiment, the logic 304 may include all of or portions of the interface circuit 200 shown in FIG. 2. In a particular embodiment, the logic 304 may be a processor adapted to determine reliability data such as error detection data (EDD), error correction data (ECD), or any combination thereof related to the primary data. For simplicity of discussion, only determination and storage of ECD is discussed with reference to FIG. 3; however, it is recognized that similar systems and methods may be used to determine and store EDD.

The system 300 also includes a first memory device 306 and a second memory device 312. In a particular illustrative embodiment, the first memory device 306 may include a rotatable, non-volatile memory medium such as the disc 108 shown in FIG. 1 and FIG. 2. In a particular illustrative embodiment, the second memory device 312 may include a solid-state memory device, such as the solid state non-volatile memory device 240 shown in FIG. 2. The second memory device 312 may have a faster data access time than the first memory device 306. For example, while the second memory device 312 may include a solid-state memory medium, the first memory device 306 may include movable, mechanical components. Thus, the first memory device 306 may have latency as a result of moving mechanical components into position to orient a read head or write head with respect to the memory medium.

The processor 304 may store the primary data at the first memory device 306, and may store the reliability data at the second memory device 312. The reliability data may include redundancy information, EDD, ECD, or any other type of data that may improve the reliability of the first memory device 306.

In a particular embodiment, the first memory device 306 may be divided into a plurality of memory regions, such as a first memory region 310 and a second memory region 324. In an illustrative embodiment, each memory region 310, 324 may include one or more sectors of a hard disc drive. The memory regions 310, 324 may be located in proximity to one another, e.g., in the same track; remote from one another on the same disc; remote from one another on different discs within the first memory device; or any combination thereof. Additionally, although only two memory regions are illustrated and discussed, the first memory device may include any number of memory regions, and the methods discussed herein may also relate to any number of memory regions. The ECD may allow correction of errors affecting entire memory regions 310 or 324 of the first memory device 306. Each of the memory regions 310, 324 may be identified by a physical block address (PBA). The processor 304 may utilize the PBAs as a map to identify where particular data is stored on the memory medium of the first memory device 306. For example, a request to access data received from the host device may identify the data by a logical block address (LBA). The processor 304 may access a table that relates the LBA to a PBA to identify a physical location at the first memory device 306 that corresponds to the requested data.

In a particular embodiment, the second memory device 312 may include EDD, ECD or both related to primary data stored at the first memory device 306. For example, the second memory device 312 may include a table 314 (or other data structure) associating data stored at the first memory device 306 with ECD stored at the second memory device 312. In an illustrative embodiment, the table 314 may relate ECD 318 to a PBA 320 of the first memory device 306. To illustrate, the first memory region 310 may have a PBA 320 illustrated as "Py". The illustrated table 314 indicates that the PBA 320 Py is associated with ECD 318 illustrated as "ECDy".

In a particular illustrative embodiment, primary data received by the processor 304 may be stored at the first memory region 310 of the first memory device 306. The processor 304 may determine ECD 318 related to the primary data, and may store the ECD 318 at the second memory device 312. The processor 304 may relate the ECD 318 to the primary data. For example, the processor 304 may generate an entry in the table 314 indicating that the ECD 318 "ECDy" is associated with data stored at the particular PBA 320 "Py". Since the second memory device 312 has faster access time than the first memory device 306, storing the ECD at the second memory device 312 may not substantially reduce the speed of writing data to or reading data from the first memory device 306.

In a particular embodiment, the processor 304 may generate EDD, ECD or both based on data stored at more than one memory region of the first memory device 306. For example, the processor 304 may generate error detection data (EDD), such as parity data, or error correction data (ECD), such as super-parity data, based on a plurality of memory regions of the first memory device 306. In a particular embodiment, the ECD may be determined using Hamming code, Reed-Solomon code, BCH code, Reed-Muller code, Binary Golay code, convolutional code, turbo code, any other error correction method, or any combination thereof. In a particular illustrative embodiment, each time the primary data is changed, the ECD may be updated. For example, the processor 304 may generate the ECD 318 based on the first data 308 stored at the first memory region 310 and the second data 322 stored at the second memory region 324. To determine the ECD 318, the processor 304 may access the second data 322 and determine the ECD based on an error correction algorithm using the second data 322 and the primary data. In another example, new ECD may be determined based on the primary data and the old ECD 318 stored at the second memory device 312. That is, rather than accessing the second data 322 to determine new ECD (which would require additional read time due to the read latency of the first memory device), the processor 304 may determine the ECD based on the old ECD 318 and the primary data. For example, the new ECD may be determined by performing an exclusive OR (XOR) operation using the primary data and the old ECD 318 Thus, a significant delay is not experienced as a result of accessing the second data 322 at the second memory region 324.

Figure 4:
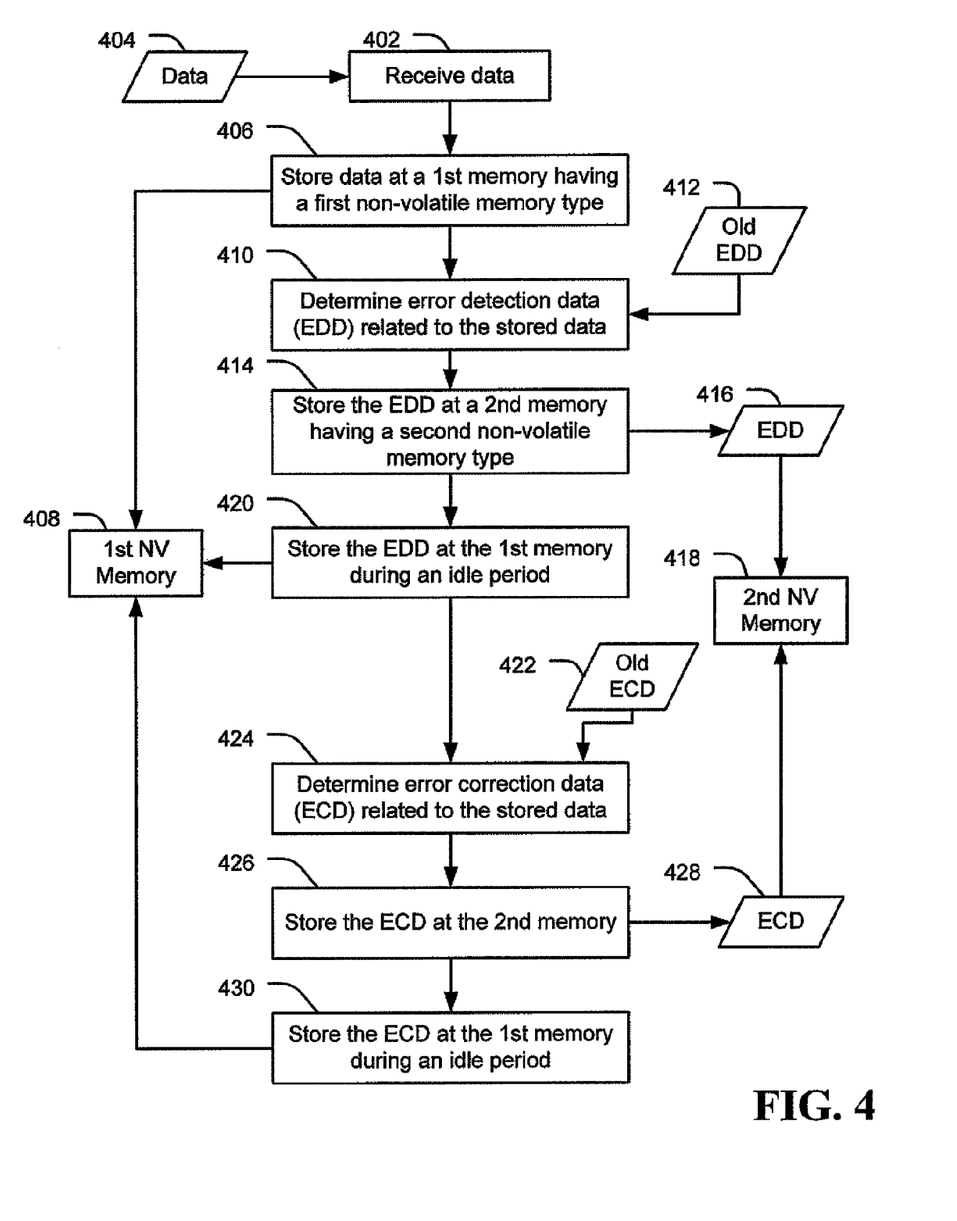
FIG. 4 is a flow diagram of a first illustrative embodiment of a method of storing reliability data.

Referring to FIG. 4, a flow diagram of an embodiment of a method of storing reliability data is depicted and generally designated 400. The method 400 includes, at 402, receiving data 404 from a host device. The method 400 also includes, at 406, storing the data 404 at a first memory 408. The first memory 408 has a first non-volatile memory type. In a particular illustrative embodiment, the first memory 408 may include a rotatable memory medium, such as the disc 108 shown in FIG. 1 and FIG. 2.

In a particular embodiment, the method 400 may also include, at 410, determining error detection data (EDD) 416 related to the stored data 404. For example, the EDD 416 may include parity data determined using a logical exclusive OR (XOR) operation. In a particular embodiment, the EDD 416 may be determined based on previously stored EDD 412. For example, the data 404 may be XORed with previously stored EDD 412 to determine the new EDD 416.

In a particular embodiment, the method 400 may also include, at 414, storing the EDD 416 at a second memory 418 having a second non-volatile memory type. In an illustrative embodiment, the second memory 418 may include a solid-state memory, such as the solid state non-volatile memory device 240 shown in FIG. 2. Thus, the second memory 418 may have a faster access time than the first memory 408. In a particular embodiment, at 420, the EDD 416 may be stored to the first memory 408 during an idle period, e.g., when no other data is being read from or written to the first memory 408. In another particular embodiment, the EDD 416 may not be stored at the first memory 408.

In a particular embodiment, the method 400 may also include, at 424, determining error correction data (ECD) 428 related to the stored data 404, and, at 426, storing the ECD 428 at the second memory 418. The ECD 428 may include super parity data. In a particular embodiment, the ECD 428 may be determined by performing an XOR operation using data from several independent memory regions of the first memory 408. The ECD may be based on data stored at the several independent memory regions of the first memory 408. In a particular example, a separate ECD calculation may be made for each of the several independent memory regions. In another example, when the primary data 404 is updating existing data for which old ECD 422 is available, the ECD 428 may be determined by XORing the old ECD 422 with the primary data 404. Thus, the ECD 428 may be determined based at least partially on the ECD 422 previously stored in the second memory 418.

In a particular embodiment, at 430, the ECD 428 may be stored to the first memory 408 during an idle period, e.g., when no other data is being read from or written to the first memory 408. In another particular embodiment, the ECD may not be stored at the first memory 408.

Figure 5:
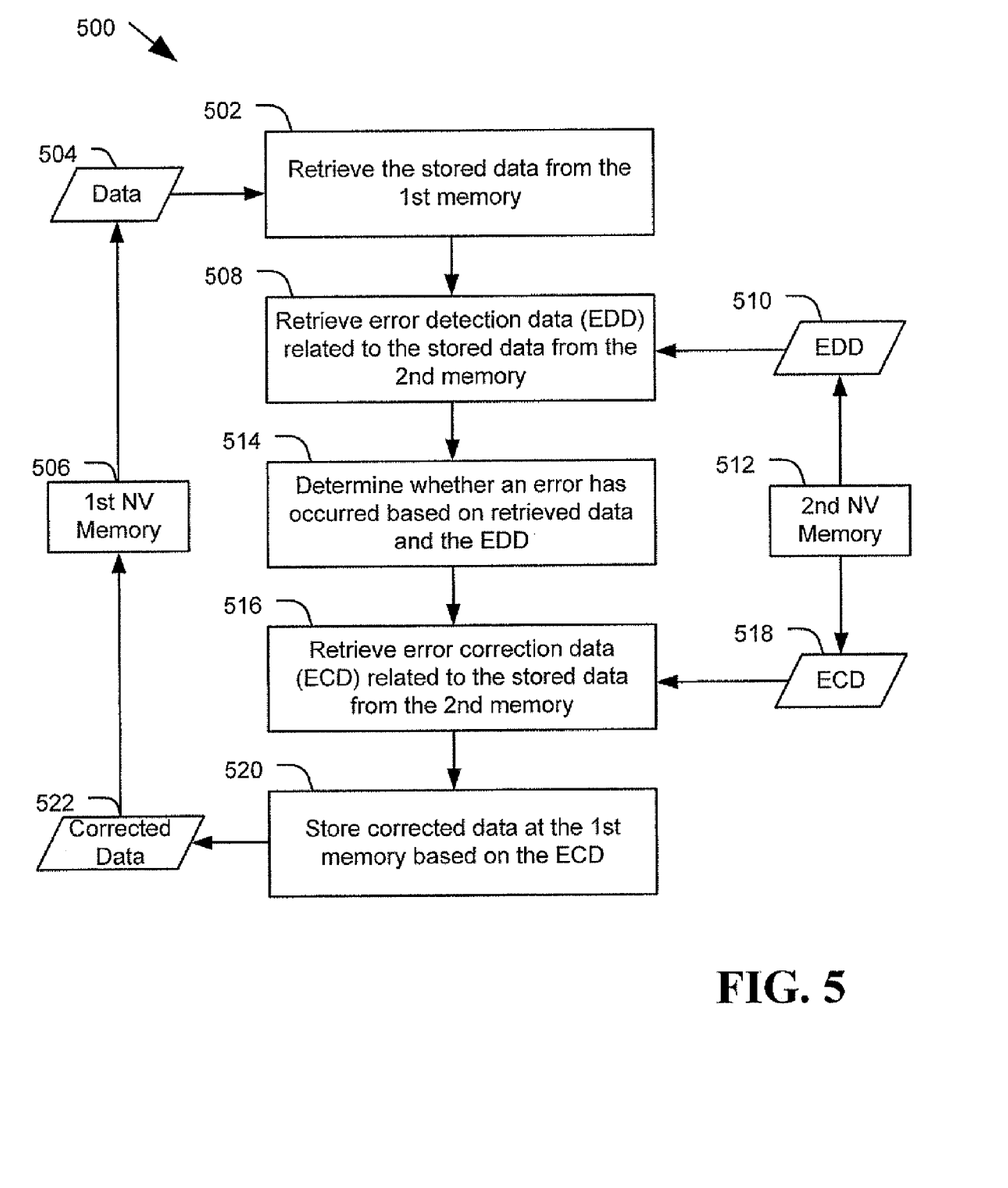
FIG. 5 is a flow diagram of second illustrative embodiment of a method of accessing reliability data.

Referring to FIG. 5, a flow diagram of an embodiment of a method of accessing reliability data is depicted and generally designated 500. The method 500 includes, at 502, retrieving data 504 stored at a first memory 506. The method 500 also includes, at 508, retrieving error detection data (EDD) 510 related to the data 504 from a second memory 512. The data 504 and the EDD 510 may be used, at 514, to determine whether an error has occurred.

If an error has occurred, the method 500 may include, at 516, retrieving error correction data (ECD) 518 related to the data 504 from the second memory 512. The method 500 may include determining corrected data 522 based at least partially on the ECD 518. For example, a logical "exclusive or" (XOR) operation may be performed using the ECD 518 and other data from the first memory 506 or the second memory 512 to determine the corrected data 522. The corrected data 522 may be stored at the first memory 506, at 520.

In accordance with various embodiments, the methods described herein may be implemented as one or more software programs running on a computer processor or controller, such as the controller 220 depicted in FIG. 2. In accordance with another embodiment, the methods described herein may be implemented as one or more software programs running on a host device, such as a PC that is using a disc drive. Dedicated hardware implementations including, but not limited to, application specific integrated circuits, programmable logic arrays and other hardware devices can likewise be constructed to implement the methods described herein.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be reduced. Accordingly, the disclosure and the figures are to be regarded as illustrative rather than restrictive One or more embodiments of the disclosure may be referred to herein, individually and/or collectively, by the term "invention" merely for convenience and without intending to limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    storing data at a first memory having a first non-volatile memory type;
    determining error correction data related to the stored data; and
    storing the error correction data, separately from the stored data, at a second memory having a second non-volatile memory type;
    wherein the first non-volatile memory has a slower random access capability than the second non-volatile memory.

2. The method of claim 1, wherein the first non-volatile memory type comprises a magnetic disc and the second non-volatile memory type comprises a solid-state memory.

3. The method of claim 1, wherein the first non-volatile memory type is a non-volatile memory type selected from one of magnetic memory, optical memory, and magneto-optical memory.

4. The method of claim 1, wherein the second non-volatile memory type comprises a flash memory.

5. The method of claim 1, further comprising updating the error correction data in real time at the second memory when data is stored at the first memory.

6. The method of claim 1, further comprising determining error detection data related to the stored data, and storing the error detection data at the second memory.

7. The method of claim 6, wherein the error detection data comprises parity data.

8. The method of claim 6, further comprising:
    retrieving the stored data from the first memory;
    retrieving the error detection data related to the stored data from the second memory; and
    determining whether an error has occurred based on retrieved data and error detection data.

9. The method of claim 1, wherein the error correction data is not stored in the first memory.

10. The method of claim 1, further comprising correcting data stored at the first memory based on the error correction data.

11. The method of claim 10, wherein the error correction data is not stored at the first memory.

12. The method of claim 1, further comprising storing the error correction data at the first memory during an idle period of the first memory.

13. The method of claim 1, wherein the first memory type and the second memory type are distinct.

14. A system comprising:
    a first non-volatile memory of a first memory type to store data;
    an error correction circuit to determine error correction data related to the data stored at the first non-volatile memory; and
    a second non-volatile memory of a second memory type to store the error correction data separately form the data stored at the first non-volatile memory;
    wherein the first non-volatile memory has a slower random access capability than the second non-volatile memory.

15. The system of claim 14, wherein the first non-volatile memory comprises a magnetic disc and the second non-volatile memory comprises a solid-state memory.

16. The system of claim 14, further comprising:
    a controller coupled to the first non-volatile memory and the second non-volatile memory, wherein the controller manages data storage a data storage function of the first non-volatile memory and the second non-volatile memory;

a buffer coupled to the controller and that receives data; and an interface connector that couples to a host device and to the buffer to provide data from the host device to the buffer.

17. The system of claim 16, further comprising a housing that connects to a chassis of the host device, wherein the first non-volatile memory, the second non-volatile memory, the controller, the buffer, and the interface connector are coupled to the housing.

18. The system of claim 16, wherein the system comprises a single data storage unit pluggable into the host device.

19. The system of claim 16, wherein the controller is programmed to execute a method comprising:

storing data at the first non-volatile memory;

determining error correction data related to the stored data; and storing the error correction data at the second non-volatile memory.

20. A non-transitory computer readable medium having instructions to cause a processor to execute a method comprising:

determining error correction data associated with primary data, wherein the primary data is stored at a first non-volatile memory of a first memory type; and storing the error correction data, separately from the primary data, at a second non-volatile memory of a second memory type;

wherein the first memory type has a slower random access capability than the second memory type.

21. The non-transitory computer readable medium of claim 20, wherein the error correction data is determined based on previously stored error correction data and the primary data.

22. The non-transitory computer readable medium of claim 20, wherein the method further comprises determining error detection data related to the primary data, and storing the error detection data at the second non-volatile memory.

23. The non-transitory computer readable medium of claim 20, wherein the error correction data is determined based at least partially on data stored at a plurality of independent memory regions of the first non-volatile memory.

24. The non-transitory computer readable medium of claim 20, wherein the method further comprises correcting the primary data based on the error correction data.

* * * * *